(12) United States Patent
Nakamura

(10) Patent No.: US 8,390,737 B2
(45) Date of Patent: Mar. 5, 2013

(54) IMAGING MODULE

(75) Inventor: Mikio Nakamura, Tokyo (JP)

(73) Assignee: Olympus Corporation, Tokyo (JP)

( * ) Notice: Subject to any disclaimer, the term of this patent is extended or adjusted under 35 U.S.C. 154(b) by 153 days.

(21) Appl. No.: 12/860,390

(22) Filed: Aug. 20, 2010

(65) Prior Publication Data

US 2011/0043672 A1 Feb. 24, 2011

(30) Foreign Application Priority Data

Aug. 21, 2009 (JP) ................... 2009-192372

(51) Int. Cl.
*H04N 5/225* (2006.01)
(52) U.S. Cl. ...................................... 348/373
(58) Field of Classification Search .......... 348/373–376; 257/774
See application file for complete search history.

(56) References Cited

U.S. PATENT DOCUMENTS

2004/0245649 A1* 12/2004 Imaoka ................ 257/774

FOREIGN PATENT DOCUMENTS

JP         09-173288        7/1997

* cited by examiner

*Primary Examiner* — Aung S Moe
(74) *Attorney, Agent, or Firm* — Scully Scott Murphy & Presser, P.C.

(57) ABSTRACT

An imaging module includes an imaging element provided with an external terminal that is disposed at an end of the front surface on which a light-receiving surface is formed and also includes a substrate on which the imaging element is mounted. On the back surface of the imaging element, an external connecting electrode that is electrically connected to the external terminal is disposed. On the main surface of the substrate, an imaging element connecting electrode is disposed at a position opposing the external connecting electrode. The external connecting electrode is connected to the imaging element connecting electrode.

2 Claims, 4 Drawing Sheets

IMAGING MODULE

CROSS-REFERENCE TO RELATED APPLICATION

This application is based upon and claims the benefit of priority from Japanese Patent Application No. 2009-192372, filed on Aug. 21, 2009, the entire contents of which are incorporated herein by reference.

BACKGROUND OF THE INVENTION

1. Field of the Invention

The present invention relates to an imaging module on which an imaging element is mounted.

2. Description of the Related Art

Endoscopes that are inserted into the body of a subject to observe regions to be observed are commonly known. Such endoscopes are designed to accommodate, at a distal portion of a long thin flexible insertion tool, an electronic circuit module on which an imaging element is mounted, whereby, by inserting the insertion tool into a body cavity, it is possible to observe regions to be observed or the like. To alleviate patient's pain, there is requirement to make the distal portion of the insertion tool as short as possible and with a minimum diameter.

In order to meet the requirement, there is a technology that focuses on the space that is used to dispose a bonding wire in an imaging element (see Japanese Laid-open Patent Publication No. 09-173288). Similar to Japanese Laid-open Patent Publication No. 09-173288, with an imaging module having a configuration in which a prism is mounted on an imaging element, a holding member that holds an objective optical system is arranged, via the prism, on an upper surface (front surface) of the imaging element. On the front surface of the imaging element, external terminals for making external connections are disposed except in the area arranged the light-receiving surface. In such a case, it is necessary to reserve an area for arranging the holding member. In Japanese Laid-open Patent Publication No. 09-173288, when the external terminals are arranged, by arranging an area in which external terminals are not provided, a holding member is arranged in that area; therefore, it is possible to reduce the diameter of the distal portion of the insertion tool.

SUMMARY OF THE INVENTION

An imaging module according to an aspect of the present invention includes an imaging element provided with an external terminal that is disposed at an end of a front surface on which a light-receiving surface is formed; and a substrate on which the imaging element is mounted. On a back surface of the imaging element, an external connecting electrode that is electrically connected to the external terminal is disposed. On a main surface of the substrate, an imaging element connecting electrode is disposed at a position opposing the external connecting electrode. The external connecting electrode is connected to the imaging element connecting electrode.

The above and other features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
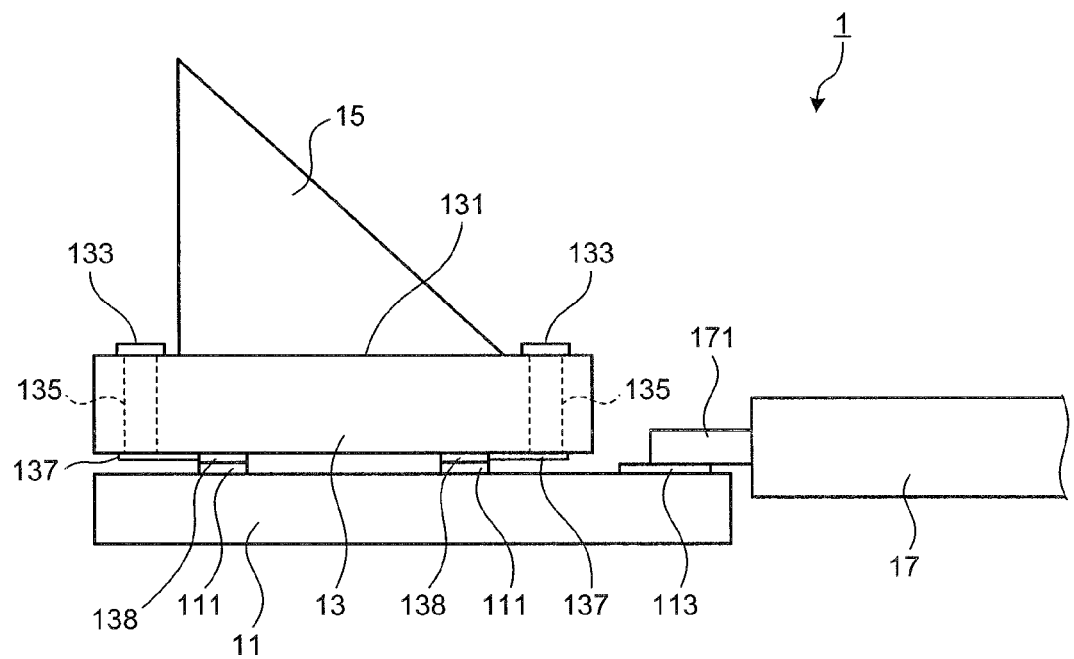
FIG. 1 is a schematic side view of an example configuration of an imaging module according to a first embodiment.

Detailed description of the preferred embodiments will be described below with reference to the drawings. The present invention is not limited to these embodiments. In the drawings, elements that are identical to those in embodiments are assigned the same reference numerals.

FIG. 1 is a schematic side view of an example configuration of an imaging module 1 according to a first embodiment. As illustrated in FIG. 1, the imaging module 1 includes a substrate 11 on the main surface (upper surface) of which are disposed imaging element connecting electrodes 111 and a distribution cable connecting electrode 113. An imaging element 13 is mounted on the substrate 11 via the imaging element connecting electrodes 111, and a distribution cable 17 is connected to the substrate 11 via the distribution cable connecting electrode 113.

Figure 2:
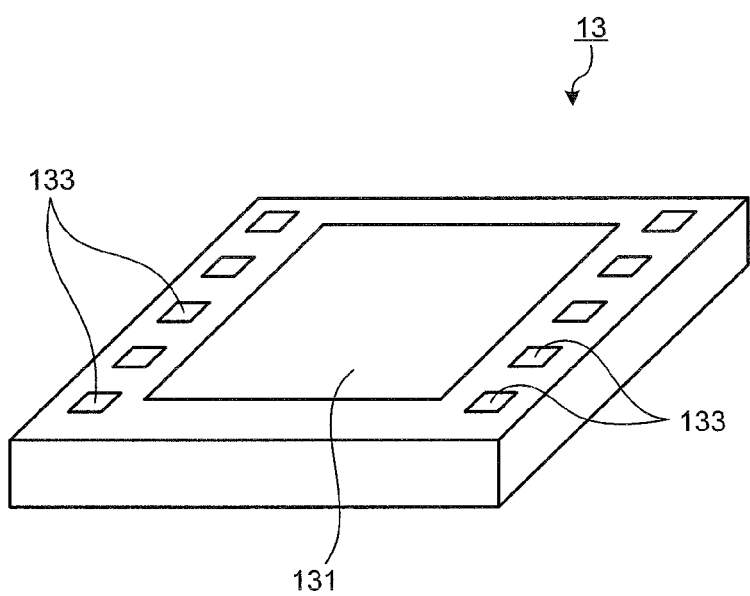
FIG. 2 is a perspective view explaining the configuration of the imaging element according to the first embodiment.
Figure 3:
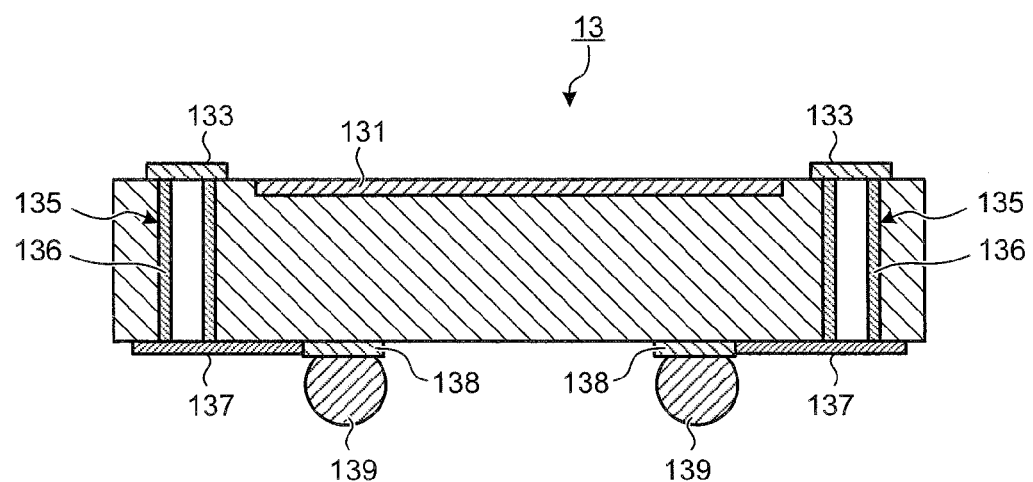
FIG. 3 is a sectional view of the imaging element according to the first embodiment.

The imaging element 13 is mounted on the substrate 11 with a surface (front surface) facing upward on which a light-receiving surface 131 is formed. On the front surface of the imaging element 13, a prism 15 that guides incident light to the light-receiving surface 131 is mounted. FIG. 2 is a perspective view explaining the configuration of the imaging element 13. FIG. 2 illustrates the front surface of the imaging element 13 on which the light-receiving surface 131 is formed. FIG. 3 is a sectional view of the imaging element 13.

As illustrated in FIG. 2, the imaging element 13 has, on its front surface, the light-receiving surface 131 and has a configuration in which a plurality of external terminals 133 is disposed in an area other than the light-receiving surface 131. As illustrated in FIGS. 1 and 3, through-hole electrodes (TSV) 135 that connect the external terminals 133, disposed on the front surface of the imaging element 13, to the imaging element connecting electrodes 111 arranged on the substrate 11 are formed in the imaging element 13. Furthermore, on the back surface of the imaging element 13, external connecting electrodes 138, which are connected to the imaging element connecting electrodes 111, are disposed and are connected to the lower ends of the through-hole electrodes 135 via conductive films 137 that are arranged therebetween. In addition, as illustrated in FIG. 3, solder balls 139 for connecting the imaging element connecting electrodes 111 are arranged on the external connecting electrodes 138.

The imaging element 13 is produced, for example, as follows. The external connecting electrodes 138 are formed, on the back surface of the imaging element 13, by plating. Furthermore, through-holes are arranged, by drilling using, for example, laser irradiation, at a position on the back surface of the imaging element 13 opposing the external terminal 133 on the front surface of the imaging element 13. Then, as illustrated in FIG. 3, on the inner surface of the through-holes, conductive films 136 are arranged by sputtering or plating to form the through-hole electrodes 135. Then, the conductive films 137 are arranged between the lower end of each through-hole electrode 135 and its corresponding external connecting electrode 138.

Figure 4:
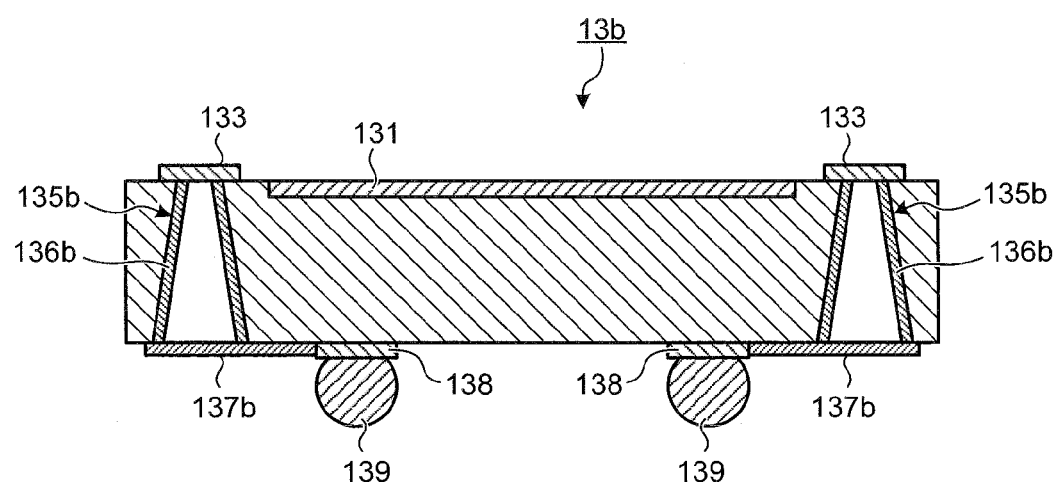
FIG. 4 is a sectional view of an imaging element according to a modification.

The method of processing through-holes used for forming the through-hole electrodes in the imaging element is not necessarily limited to the method detailed above. Drilling or etching can also be used. FIG. 4 is a sectional view of an imaging element 13b in which through-holes are formed using wet etching. In a case in which the through-hole is formed using wet etching, in a similar manner as in the first embodiment, conductive films 136b are also arranged on the inner surfaces of the through-holes to form through-hole electrodes 135b. Then, conductive films 137b are arranged between the lower end of each through-hole electrode 135b and its corresponding external connecting electrode 138.

Then, when the imaging module 1 is produced, the imaging element 13 is placed on the substrate 11 with the front surface of the imaging element 13 facing upward. External connecting electrodes 138 (solder balls 139 arranged at the external connecting electrodes 138), which are arranged on the back surface of the imaging element 13, are brought into contact with their corresponding imaging element connecting electrodes 111 on the substrate 11 and they are connected by soldering. At this time, the external connecting electrodes 138 and the imaging element connecting electrodes 111 are disposed at a position where they face each other when they are arranged on the substrate 11 of the imaging element 13. Furthermore, the distribution cable 17, whose core wire 171 of the distal portion is exposed, is arranged in such a manner that the axial direction thereof is along the main surface of the substrate 11, and the side face of the core wire 171 of the distal portion is connected, by soldering, to the distribution cable connecting electrode 113.

As described above, with the imaging module 1 according to the first embodiment, the external connecting electrodes 138, which are electrically connected to the external terminals 133 on the front surface of the imaging element 13, are disposed on the back surface of the imaging element 13. Furthermore, on the main surface of the substrate 11, in the mounting area for the imaging element 13, the imaging element connecting electrodes 111 are disposed at positions opposing the external connecting electrodes 138. Subsequently, external connecting electrodes 138 are brought into contact with the imaging element connecting electrodes 111 and connected to each other. The imaging element 13 is then mounted on the substrate 11. As a result, it is not necessary to reserve, at a position other then a mounting area for the imaging element, an area for disposing electrodes that are used to connect the imaging element. Accordingly, the size of the substrate can be reduced by that amount, thus making the imaging module smaller.

Furthermore, unlike the conventional technology, wire bonding is not used to connect the external terminals of the imaging element to the electrodes on the substrate. Accordingly, even in a case, such as the one described in the description of the related art, in which a holding member that holds an objective optical system is arranged on the front surface of the imaging element 13, there is no need to reserve an area for arranging the holding member by providing an area in which the external terminal is not arranged. For example, the holding member can be arranged at a position above the external terminal and overlapped with the external terminal.

Figure 5:
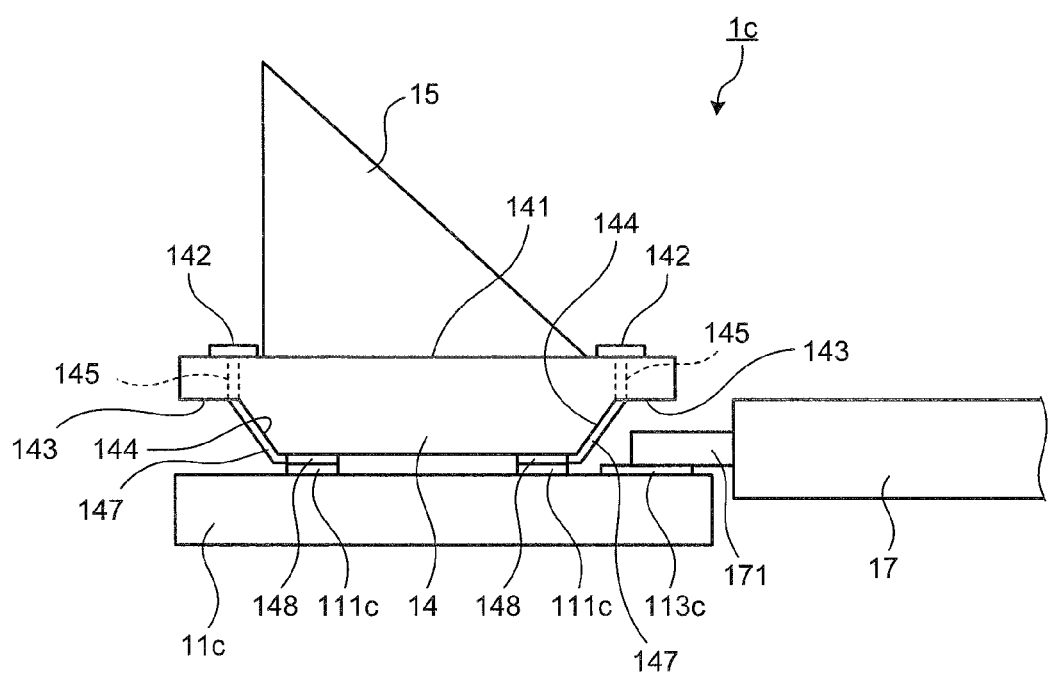
FIG. 5 is a schematic side view of an example configuration of an imaging module according to a second embodiment.

FIG. 5 is a schematic side view of an example configuration of an imaging module 1c according to a second embodiment. As illustrated in FIG. 5, in a similar manner as in the first embodiment, the imaging module 1c includes a substrate 11c on the main surface (upper surface) of which are disposed imaging element connecting electrodes 111c and a distribution cable connecting electrode 113c. An imaging element 14 is mounted on the substrate 11c by the imaging element connecting electrodes 111c, and the distribution cable 17 is connected to the substrate 11c via the distribution cable connecting electrode 113c.

Furthermore, in a similar manner as in the first embodiment, the imaging element 14 is mounted on the substrate 11c with a surface (front surface) facing upward on which a light-receiving surface 141 is formed. The prism 15 that guides incident light to the light-receiving surface 141 is mounted on the front surface of the imaging element 14.

The imaging element 14 has shoulder sections 143 formed by cutting out both ends of the back surface of the imaging element 14 toward a position opposing an external terminal 142 disposed on the front surface of the imaging element 14. The imaging element 14 has inclined surfaces 144 at both ends thereof. Through-hole electrodes 145 passing through the shoulder sections 143 are formed below their corresponding external terminals 142. External connecting electrodes 148 disposed on the back surface of the imaging element 14 are connected to the lower ends of the corresponding through-hole electrodes 145 by conductive films 147 arranged along the inclined surfaces 144.

Figure 6:
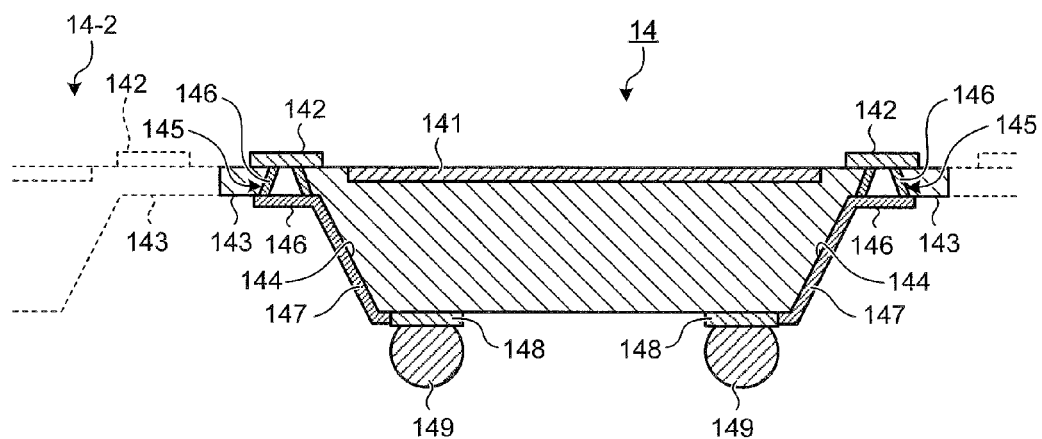
FIG. 6 is a sectional view of the imaging element according to the second embodiment.

FIG. 6 is a sectional view of the imaging element 14 explaining a production process thereof. In FIG. 6, an adjacent imaging element 14 (14-2) in a wafer state is illustrated by the dashed line. Each of the imaging elements 14 is formed as follows. External connecting electrodes 148 are formed by plating on the back surface of the imaging element 14. The boundary portion of the imaging element 14 on the back surface thereof is processed by wet etching to form, at both ends of the back surface of the imaging element 14, the shoulder sections 143 and the inclined surfaces 144. Thereafter, the formed shoulder sections 143 are further processed by wet etching to form through-holes for forming through-hole electrodes 145, whereby the external terminals 142 arranged on the front surface of the imaging element 14 are exposed. Then, by sputtering or plating, conductive films 146 are arranged on the inner surface of the through-holes to form the through-hole electrodes 145. The conductive films 147 are arranged between the lower end of each through-hole electrode 145 and its corresponding external connecting electrode 148. Furthermore, solder balls 149 for connecting to the imaging element connecting electrode 111c are arranged on the external connecting electrodes 148.

In the second embodiment, as illustrated in FIG. 5, the distribution cable connecting electrode 113c, disposed on the substrate 11c, is disposed below the external terminals 142. Furthermore, the distal portion of the distribution cable 17 is arranged in a space formed, by the shoulder section 143 and the inclined surface 144, below the external terminal 142, where a side face of the core wire 171 is connected to the distribution cable connecting electrode 113c.

When the imaging module 1c is produced, the imaging element 14 is placed on the substrate 11c with the front surface of the imaging element 14 facing upward. The external connecting electrodes 148, which are arranged on the back surface of the imaging element 14, are brought into contact with their corresponding imaging element connecting electrodes 111c on the substrate 11c and they are connected by soldering or the like. Furthermore, the distribution cable 17, whose core wire 171 of the distal portion is exposed, is arranged in such a manner that the axial direction thereof is along the main surface of the substrate 11c, and the side face of the core wire 171 of the distal portion is connected, by soldering, to the distribution cable connecting electrode 113c.

As described above, with the imaging module 1c according to the second embodiment, it is possible to provide the same advantage as that provided in the first embodiment. Furthermore, in the second embodiment, the distribution cable connecting electrode 113c is disposed at a position on the substrate 11c and below the external terminal 142. The space is formed, above the substrate 11c and below the external terminal 142, by cutting out the ends of the back surface of the imaging element 14. Then, in this space, the distribution cable 17, whose core wire 171 of the distal portion is exposed, is arranged so as to connect it to the distribution cable connecting electrode 113c. Accordingly, it is possible to further reduce the size of the substrate, thus implementing an even greater size reduction of the imaging module.

Figure 7:
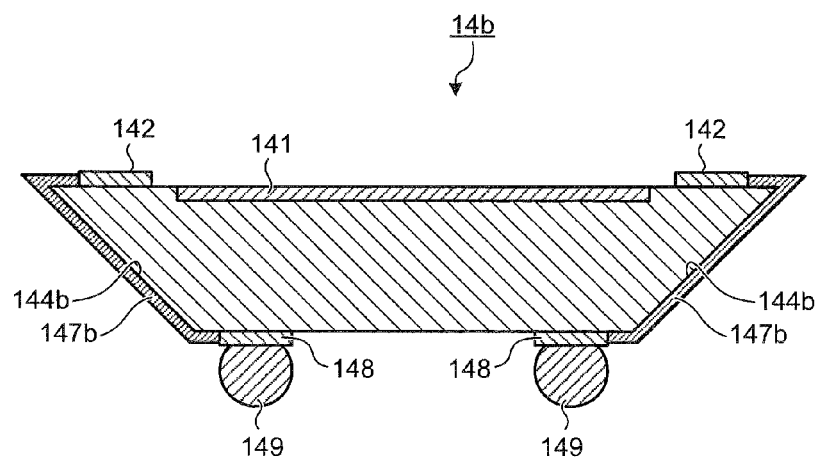
FIG. 7 is a sectional view of an imaging element according to a modification.

In the second embodiment, the shoulder sections 143 and the inclined surfaces 144 are formed on the back surface of the imaging element 14. By making the through-hole electrodes 145 that pass through the shoulder sections 143 and by arranging the conductive films 147 along the inclined surfaces 144, the external terminals 142, which are arranged on the front surface of the imaging element 14, are connected to their corresponding external connecting electrodes 148, which are arranged on the back surface of the imaging element 14; however the configuration is not limited thereto. FIG. 7 is a sectional view of an imaging element 14b of a modification. As illustrated in FIG. 7, by diagonally cutting out both ends of the back surface of the imaging element 14b to form inclined surfaces 144b and by arranging, along the inclined surfaces 144b, conductive films 147b between the external terminal 142 arranged on the front surface of the imaging element 14 and the external connecting electrode 148 arranged on the back surface of the imaging element 14, the external terminals 142 can be connected to their corresponding external connecting electrodes 148.

With the imaging module according to the present invention, external connecting electrodes that are electrically connected to external terminals on the front surface of an imaging element are disposed on the back surface of the imaging element. Imaging element connecting electrodes that are used to connect the imaging element are disposed on positions on a substrate opposing the external connecting electrodes. As a result, there is no need to arrange the imaging element connecting electrodes so as to avoid the mounting area for the imaging element.

Accordingly, it is possible to reduce the size of the substrate and thus make the imaging module smaller.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging module to which a distribution cable is connected, the imaging module comprising:
    an imaging element provided with an external terminal that is disposed at an end of a front surface on which a light-receiving surface is formed;
    a substrate on which the imaging element is mounted;
    an external connecting electrode disposed on a back surface of the imaging element and electrically connected to the external terminal;
    an imaging element connecting electrode disposed on a main surface of the substrate and disposed at a position opposing the external connecting electrode; and
    a distribution cable connecting electrode disposed on the main surface of the substrate and disposed at a position below the external terminal, wherein
    the external connecting electrode is connected to the imaging element connecting electrode,
    a space is formed below the external terminal by cutting out an end of the back surface of the imaging element, and
    an exposed core wire of a distal portion of a distribution cable is arranged in the space and is connected to the distribution cable connecting electrode.

2. The imaging module according to claim 1, wherein
    the imaging element includes a through-hole electrode that passes through the imaging element at a position below the external terminal, and
    the external terminal is connected to the external connecting electrode via the through-hole electrode.

* * * * *